United States Patent [19]
Yamasaki et al.

[11] Patent Number: 5,625,586
[45] Date of Patent: Apr. 29, 1997

[54] SEMICONDUCTOR MEMORY HAVING A PLURALITY OF MEMORY BANKS AND SUB-BIT LINES WHICH ARE CONNECTED TO A MAIN BIT LINE VIA MOS TRANSISTORS WHOSE GATES ARE COMMONLY CONNECTED TO A SELECTION LINE

[75] Inventors: Kazuyuki Yamasaki; Teiichiro Nishizaka; Kazutaka Otsuki, all of Tokyo, Japan

[73] Assignee: NEC Corporation, Tokyo, Japan

[21] Appl. No.: 606,300

[22] Filed: Feb. 23, 1996

[30] Foreign Application Priority Data

Feb. 23, 1995 [JP] Japan ................................ 7-035027

[51] Int. Cl.$^6$ .................................................. G11C 17/00
[52] U.S. Cl. ............... 365/104; 365/185.16; 365/185.17; 365/185.13
[58] Field of Search ..................... 365/185.16, 185.21, 365/185.03, 185.17, 104, 184, 185.13

[56] References Cited

U.S. PATENT DOCUMENTS

| | | | |
|---|---|---|---|
| 5,040,134 | 8/1991 | Park | 365/185.03 |
| 5,086,413 | 2/1992 | Tsuboi et al. | 365/230.01 |
| 5,345,416 | 9/1994 | Nakagawara | 365/185.13 |
| 5,392,233 | 2/1995 | Iwase | 365/185.16 |

FOREIGN PATENT DOCUMENTS

| | | |
|---|---|---|
| 0627742 | 12/1994 | European Pat. Off. |
| 5-167042 | 7/1993 | Japan |
| 6-318683 | 11/1994 | Japan |

*Primary Examiner*—David C. Nelms
*Assistant Examiner*—Michael T. Tran
*Attorney, Agent, or Firm*—Sughrue, Mion, Zinn, Macpeak & Seas

[57] ABSTRACT

In a semiconductor memory comprising one main bit line D1, a pair of main ground lines VG1 and VD2, a plurality of memory cell banks to be selectively connected to the main bit line D1 and the main ground lines VG1 and VD2, and a plurality of word lines W1 to Wn extending through the memory cell banks, each of the memory cell banks includes a plurality of wirings L1, L2, L3, L4 and L5 located in parallel to each other, and a threshold of a block selection transistor BT11 connected between the main bit line D1 and the wiring L3, is lower than that of block selection transistors BT12 and BT13 connected between the main bit line D1 and the wiring L2 and between the main bit line D1 and the wiring L4, respectively.

11 Claims, 5 Drawing Sheets

SEMICONDUCTOR MEMORY HAVING A PLURALITY OF MEMORY BANKS AND SUB-BIT LINES WHICH ARE CONNECTED TO A MAIN BIT LINE VIA MOS TRANSISTORS WHOSE GATES ARE COMMONLY CONNECTED TO A SELECTION LINE

BACKGROUND OF THE INVENTION

1. Field of the Invention

The present invention relates to a semiconductor memory, and more specifically to a semiconductor memory constituted of a number of memory banks each including a plurality of lateral memory cells.

2. Description of Related Art

Figure 1:
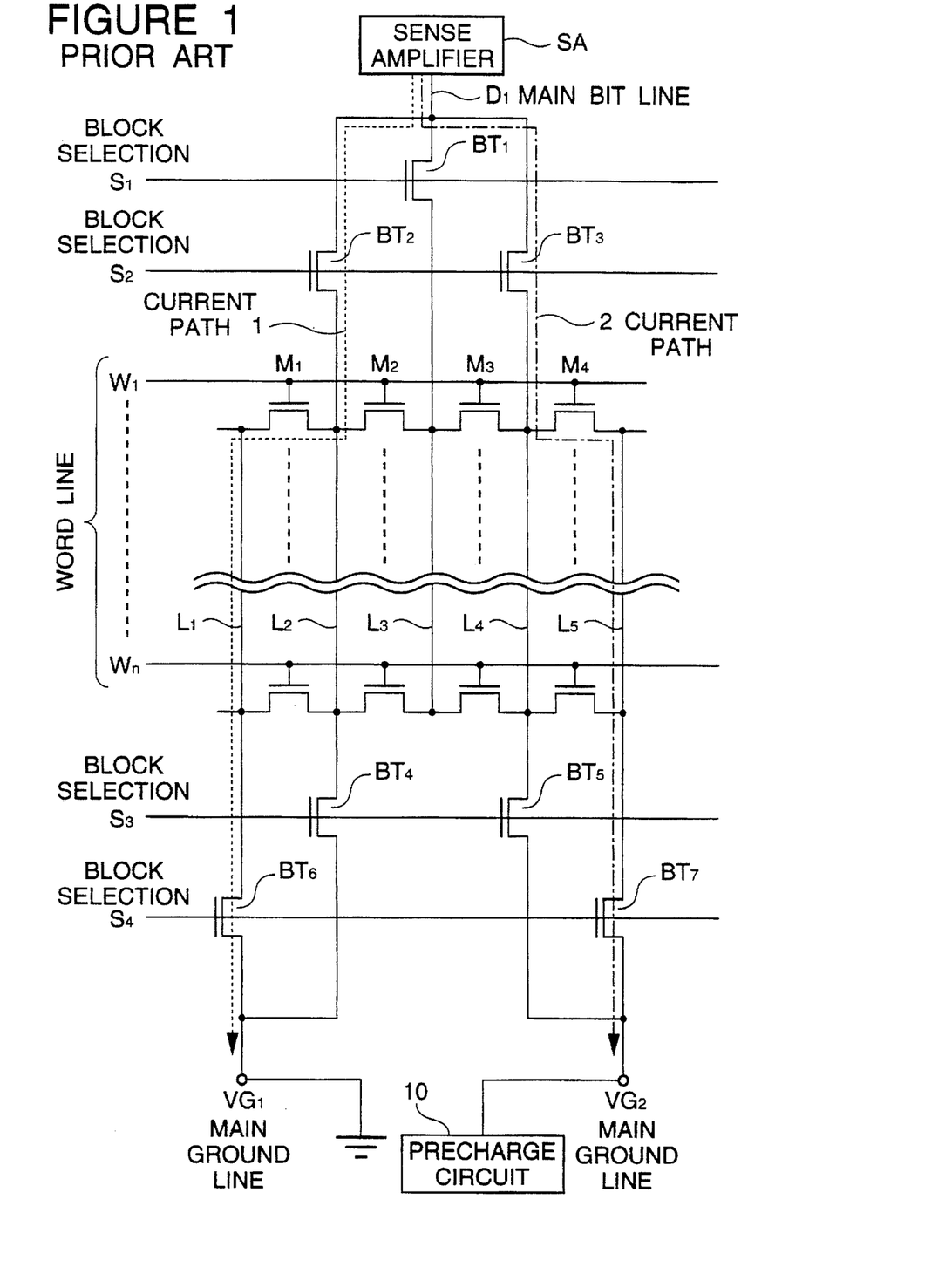
FIG. 1 is a circuit diagram of one unitary memory cell bank provided in a conventional semiconductor memory constituted of a number of lateral memory cells.

Referring to FIG. 1, there is shown an equivalent circuit diagram of one example of a ROM (read only memory) having a conventional lateral memory cell structure, which is disclosed in Japanese Patent Application Laid-open Publication No. JP-A-05-167042 and its corresponding U.S. Pat. No. 5,392,233, the disclosure of which is incorporated by reference in its entirety into this application. FIG. 1 shows only one memory cell bank of a number of memory cell banks provided in one semiconductor memory.

In one unitary bank constituted of a plurality of memory cells, a plurality of diffused layer wirings L1 to L5 are located in parallel to each other and separately from each other. Of these diffused layer wirings, the diffused layer wiring L1 is connected through a block selection transistor BT6 to a main ground line VG1, and the diffused layer wiring L2 has opposite ends thereof connected through block selection transistors BT2 and BT4 to a main bit line D1 and the main ground line VG1, respectively. The diffused layer wiring L3 is connected through a block selection transistor BT1 to the main bit line D1, and the diffused layer wiring L4 has opposite ends thereof connected through block selection transistors BT3 and BT5 to the main bit line D1 and another main ground line VG2, respectively. The diffused layer wiring L5 is connected through a block selection transistor BT7 to the main ground line VG2.

The block selection transistor BT1 has a gate electrode thereof connected to a block selection line S1, and each of the block selection transistors BT2 and BT3 has a gate electrode thereof connected to a block selection line S2. Each of the block selection transistors BT4 and BT5 has a gate electrode thereof connected to a block selection line S3, and each of the block selection transistors BT6 and BT7 has a gate electrode thereof connected to a block selection line S4.

Between the block selection line S2 and the block selection line S3, a plurality of words lines W1 to Wn are located in parallel to each other but perpendicular to the diffused layer wirings L1 to L5, and a memory cell transistor (M1, M2, M3, M4, . . .) is formed at each of intersections between the words lines W1 to Wn and a region between each pair of adjacent diffused layer wirings. Accordingly, one unitary block is constituted of a memory cell matrix having "n" rows and four columns. A gate of memory cell transistors in one row are connected to a corresponding one of the word lines. Each memory cell transistor has either a high threshold or a low threshold in accordance with data written into the memory, so that when the word line connected to the gate of the memory cell transistor is brought to a high level, the memory cell transistor is put in an ON condition or in an OFF condition, dependently upon whether the memory cell transistor has either the high threshold or the low threshold.

Now, operation of the memory cell bank shown in FIG. 1 will be described. For example, when the memory cell M1 is read out, firstly, one main bit line D1 and two main ground lines VG1 and VG2 are selected by a Y decoder (not shown) in order to select one memory bank. As the result of the selection of these three wirings, the main bit line D1 is connected to a sense amplifier SA, and one of the two main ground lines VG1 is connected to ground, and the other of the two main ground lines VG2 is connected to a precharge circuit 10 so that the main ground line VG2 is charged by the precharge circuit 10.

Next, the block selection line S2 is brought to a high level so as to turn on the block selection transistor BT2; so that the diffused layer wiring L2 connected to a drain of the memory cell M1 to be selected, is connected to the main bit line D1. Similarly, the block selection line S4 is brought to a high level so as to turn on the block selection transistor BT6, so that the diffused layer wiring L1 connected to a source of the memory cell M1 to be selected, is connected to the main ground line VG1. Finally, by action of an X decoder (not shown), the word line W1 connected to the gate of the memory cell M1 to be selected, is brought to a high level, and the other word lines are brought to a low level. Thus, there is formed a current path starting from the main bit line D1 and reaching the main ground line VG1 connected to the ground, as shown by a broken line 1 in FIG. 1, so that a discharge current I1 flows from a current source (not shown) provided in the sense amplifier SA connected to the main bit line D1.

At this time, the block selections S1 and S3 are maintained at a low level, so that the block selection transistors BT1 and BT4 are off, so as to prevent formation of another current path. Furthermore, when the memory cell M1 is selected, there is simultaneously formed a current path starting from the main bit line D1 through the memory cell M4 to reach the main ground line VG2, as shown by a one-dot chain line 2 in FIG. 1. However, since the main ground line VG2 is charged by the precharge circuit 10, no substantial potential difference occurs between the main bit line D1 and the main ground line VG2. Therefore, a discharge current I2 flowing in the current path 2 is negligible as compared with the discharge current I1 flowing in the current path 1.

The discharge current I1 is small when a resistance value of the memory cell M1 is high, namely, when the threshold voltage of the memory cell M1 is high. The discharge current I1 is large when a resistance value of the memory cell M1 is low, namely, when the threshold voltage of the memory cell M1 is low. Therefore, by detecting this current by the sense amplifier SA, it is possible to read out information written in the memory cell M1.

At the time of reading the memory cell M2, the block selection transistors BT1 and BT4 are turned on, and the block selection transistors BT2 and BT6 are turned off. Furthermore, at the time of reading the memory cell M3 or M4, the main ground line VG1 is connected to the precharge circuit 20 and the main ground line VG1 is connected to the ground, so as to activate the current path 2.

In the above mentioned semiconductor memory, at least four block selection lines (S1, S2, S3, S4) are required for each one memory cell bank, for the purpose of limiting the current path flowing through the memory cell to be selected, to only one, in order to read the information of the memory cell. Therefore, the area of the memory bank is increased.

Japanese Patent Application Laid-open Publication No. JP-A-063-18683 and its corresponding European Patent Publication No. 0 627 742 A2, the disclosure of which is incorporated by reference in its entirety into this application, discloses a second conventional semiconductor memory having a memory cell bank structure. In this second conventional semiconductor memory, by changing the amount of channel ion implantation in memory cell transistors, four different threshold voltages are realized, so that multi-value level ROM cells can be obtained. Three sub-bit lines are connected through three selection transistors, respectively, in common to one main bit line, and two sub-ground lines are connected through two selection transistors, respectively, in common to one main ground line. In addition, the sub-bit lines and the sub-ground lines are alternately arranged, so as to reduce a leakage current when the multi-value level ROM cell is read, and also so as to sufficiently ensure a margin from a reference voltage used at the reading time.

However, this second conventional semiconductor memory is so configured that the five selection transistors are controlled by five independent selection lines, respectively. Accordingly, the second conventional semiconductor memory comprises five selection lines for one memory bank. Therefore, the area of the memory bank is increased, similarly to the first conventional semiconductor memory.

SUMMARY OF THE INVENTION

Accordingly, it is an object of the present invention to provide a semiconductor memory which has overcome the above mentioned defect of the conventional one.

Another object of the present invention is to provide a semiconductor memory having a reduced number of selection lines provided for each one memory cell bank, thereby to have a reduced area for each one memory cell bank.

The above and other objects of the present invention are achieved in accordance with the present invention by a semiconductor memory comprising:

a main bit line;

a plurality of word lines located in parallel to each other;

a plurality of wirings located in parallel to each other and extending to intersect the plurality of word lines, the plurality of wirings including a first wiring having one end thereof connected through a first switching transistor to the main bit line, a second wiring having one end thereof connected to a voltage supply terminal, and a third wiring located between the first wiring and the second wiring and having one end thereof connected through a second switching transistor to the main bit line and the other end thereof connected through a third switching transistor to the voltage supply terminal;

a plurality of memory cell transistors located at intersections between the plurality of word lines and the plurality of wirings to form a memory cell matrix, the plurality of memory cell transistors being connected in such a manner that, in each of rows of the memory cell matrix, a first memory cell transistor is connected between the first wiring and the third wiring and a second memory cell transistor is connected between the second wiring and the third wiring, and a gate of each of the first and second memory cell transistors is connected to one corresponding word line of the plurality of word lines; and a first selection line connected to both a gate of the first switching transistor and a gate of the second switching transistor, a threshold of the first switching transistor being lower than that of the second switching transistor; and a second selection line connected to a gate of the third switching transistor.

According to another aspect of the present invention, there is provided a semiconductor memory comprising a main bit line and a plurality of sub-bit lines each of which is connected through a MOS field effect transistor to the main bit line, the MOS field effect transistor having any one threshold of a plurality of thresholds.

According to still another aspect of the present invention, there is provided a semiconductor memory comprising a main ground line and a plurality of sub-ground lines each of which is connected through a MOS field effect transistor to the main ground line, the MOS field effect transistor having any one threshold of a plurality of thresholds.

The above and other objects, features and advantages of the present invention will be apparent from the following description of preferred embodiments of the invention with reference to the accompanying drawings.

DESCRIPTION OF THE PREFERRED EMBODIMENTS

Figure 2:
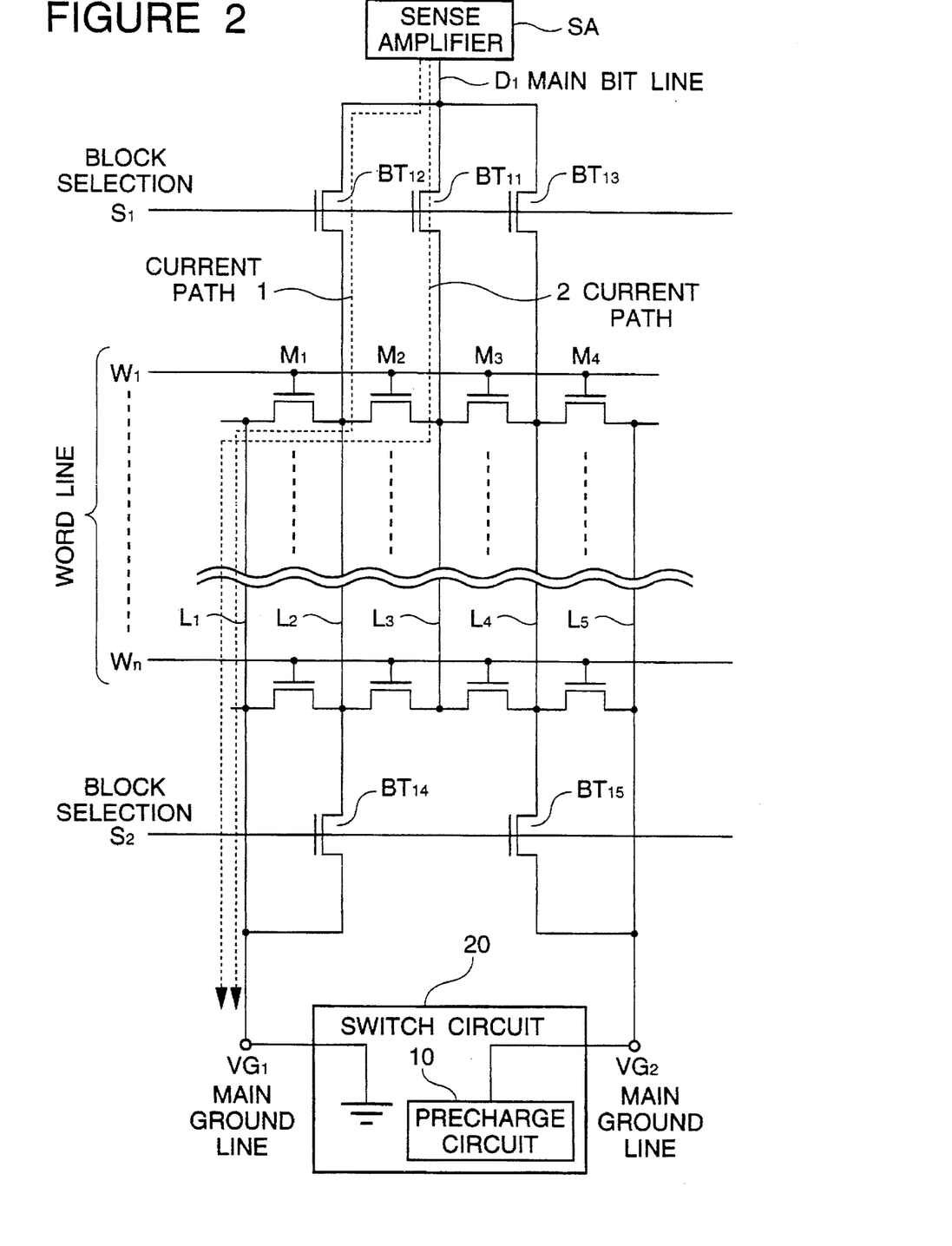
FIG. 2 is a circuit diagram of one unitary memory cell bank provided in a first embodiment of the semiconductor memory in accordance with the present invention constituted of a number of lateral memory cells.

Referring to FIG. 2, there is shown a circuit diagram of one unitary memory cell bank provided in a first embodiment of a ROM (read only memory) in accordance with the present invention constituted of a number of lateral memory cells. In FIG. 2, elements similar or corresponding to those shown in FIG. 1 are given the same Reference Numerals. In addition, the shown unitary memory cell bank is one of a number of unitary memory cell banks included in the semiconductor memory. Therefore, it is to be understood that the semiconductor memory includes a number of unitary memory cell banks similar to the shown unitary memory cell bank.

Figure 3:
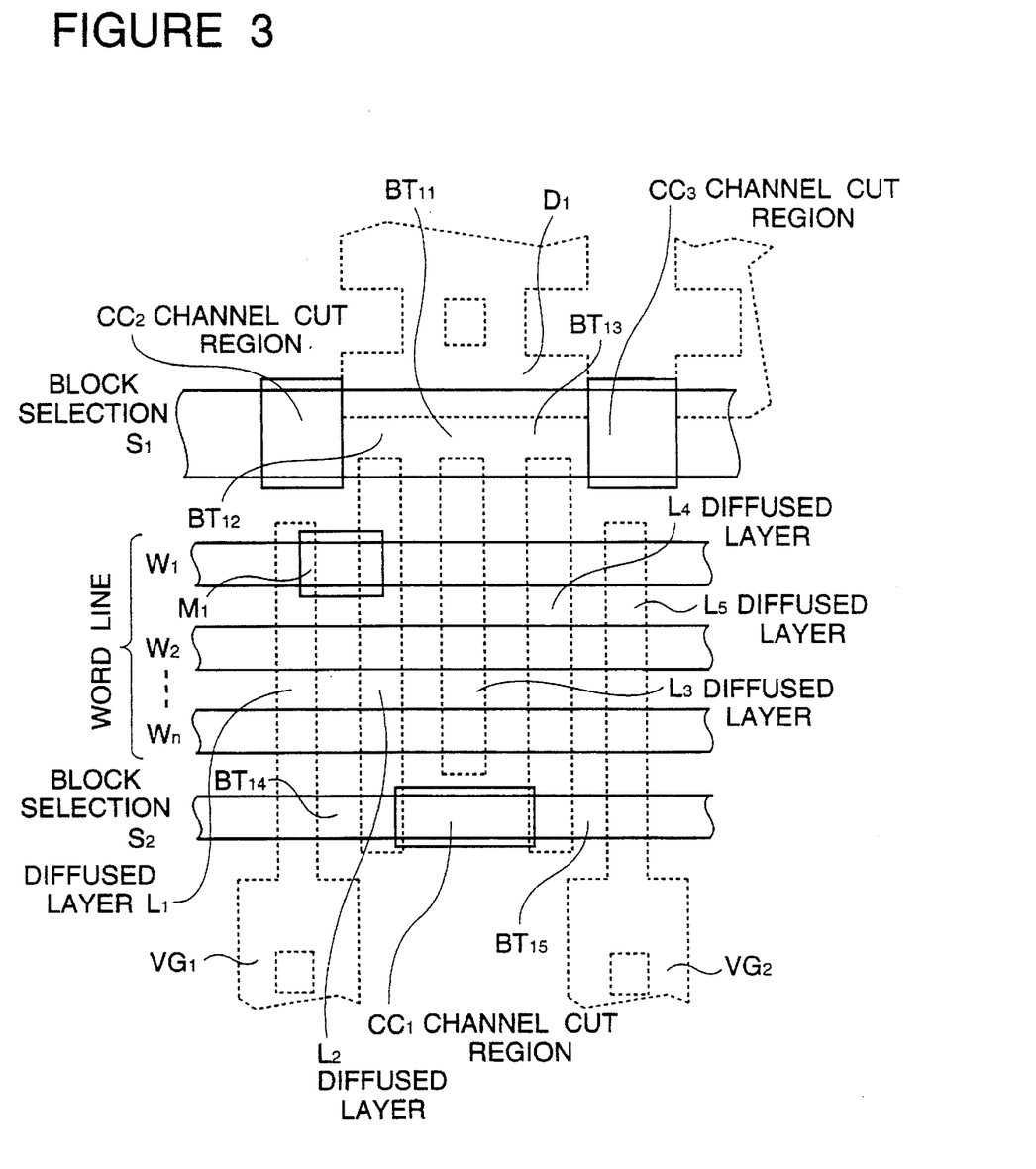
FIG. 3 is a partial layout pattern illustrating the structure of the unitary memory cell bank shown in FIG. 2.

The semiconductor memory includes one main bit line D1 and two main ground lines VG1 and VG2. In one unitary bank constituted of a plurality of memory cells, a plurality of diffused layer wirings L1 to L5 are located in parallel to each other and separately from each other, as clearly shown in FIG. 3 which is a partial layout pattern illustrating the structure of the unitary memory cell bank shown in FIG. 2. In FIG. 3, a diffused layer or region formed in a semiconductor substrate is depicted by a broken line.

Of these diffused layer wirings, the diffused layer wiring L1 is connected directly to the main ground line VG1, and the diffused layer wiring L2 has one end thereof connected through a block selection transistor BT12 (switch transistor) to the main bit line D1 and the other end thereof connected through a block selection transistor BT14 to the main ground line VG1. The diffused layer wiring L3 is connected through a block selection transistor BT11 to the main bit line D1, and the diffused layer wiring L4 has one end thereof connected through a block selection transistor BT13 to the main bit line D1 and the other end thereof connected through a block selection transistor BT15 to the main ground line VG2. The diffused layer wiring L5 is connected directly to the main ground line VG2. The block selection transistors BT11 to BT15 are formed of a MOS (metal-oxide-semiconductor) field effect transistor.

There is provided a switch circuit 20 for selectively connecting one of the main ground lines VG1 and VG2 to ground, and the other of of the main ground lines VG1 and VG2 to the precharge circuit 10, dependently upon which of memory cells is to be read out.

As clearly shown in FIG. 3, between a block selection line S1 and a block selection line S2, a plurality of words lines W1 to Wn are located, in parallel to each other and in parallel to the block selection lines S1 and S2, to perpendicularly intersect the diffused layer wirings L1 to L5. A memory cell transistor (M1, M2, M3, M4, . . . ) is formed at each of intersections between the words lines W1 to Wn and a region between each pair of adjacent diffused layer wirings. The memory cell transistor are of the MOS field effect transistor type.

Accordingly, one memory cell unitary bank is constituted of a memory cell matrix having "n" rows and four columns. A gate of memory cell transistors included in one row are connected to a corresponding one of the word lines. Each memory cell transistor has either a high threshold or a low threshold in accordance with data written into the memory, so that when the word line connected to the gate of the memory cell transistor is brought to a high level, the memory cell transistor is put in an ON condition or in an OFF condition, dependently upon whether the memory cell transistor has either the high threshold or the low threshold.

Furthermore, as shown in FIG. 3, a channel cut region CC1 is formed in a transistor channel region which is positioned under the block selection line S2 and which is positioned between the wirings L2 and L4. Another channel cut region CC2 is formed in a transistor channel region which is positioned under the block selection line S1 and which is positioned between the wiring L2 and a wiring of a memory cell bank adjacent to the wiring L2 at a left side of the wiring L2. Still another channel cut region CC3 is formed in a transistor channel region which is positioned under the block selection line S1 and which is positioned between the wiring L4 and a wiring of a memory cell bank adjacent to the wiring L4 at a right side of the wiring L4. These channel cut regions CC1, CC2 and CC3 are formed to have a high threshold, by controlling the amount of ion implantation, thereby to prevent formation of a channel.

The embodiment of the ROM (read only memory) in accordance with the present invention constituted of a number of lateral memory cells, is advantageous in the case that each memory cell is formed of a so called multi-level value cell in which each one memory cell can store two or more items of information. However, each memory cell can be formed of a conventional memory cell capable of storing only one item of information. The shown embodiment is characterized in that the block selection transistor BT11 connected between the main bit line D1 and the wiring L3 has a threshold Vt2, the block selection transistor BT12 connected between the main bit line D1 and the wiring L2 has a threshold Vt3, and the block selection transistor BT13 connected between the main bit line D1 and the wiring LA has a threshold Vt3. Each of the block selection transistors BT11, BT12 and BT13 has a gate electrode thereof connected in common to the block selection line S1. Each of the block selection transistors BT14 and BT15 has a gate electrode thereof connected in common to the block selection line S2.

In the case of causing one transistor to store two bits of information, an ion implantation to a channel region under a gate in a MOS transistor is selectively controlled so that the transistor has one of four different thresholds Vt1, Vt2, Vt3 and Vt4. Here, assume Vt1<Vt2<Vt3<Vt4. By increasing a gate voltage of the transistor in stages as Vt1→Vt2→Vt3 at constant intervals, if the set threshold of the transistor is Vt1, the condition of the transistor changes as active(ON)→active(ON)→active(ON). In the case of Vt2, the condition of the transistor changes as inactive(OFF)→active(ON)→active(ON). In the case of Vt3, the condition of the transistor changes as inactive(OFF)→inactive(OFF)→active(ON). In the case of Vt4, the condition of the transistor changes as inactive(OFF)→inactive(OFF)→inactive(OFF). Thus, the transistor can have four different conditions. Therefore, if the four different conditions are assigned four digital signal patterns (0, 0), (0, 1), (1, 0) and (1, 1), respectively, the transistor can have two bits of information.

In this embodiment, in a manner similar to a method for writing two bits of information into one memory cell by controlling the ion implantation, the block selection transistors BT12 and BT13 are set to have the threshold Vt3, and the block selection transistor BT11 is set to have the threshold Vt2. Thus, by selectively applying one of the voltage levels Vt1, Vt2 and Vt3 to the block selection line S1, it is possible to selectively read one of the memory cells M1, M2, M3 and M4. Here, Vt1<Vt2<Vt3.

Now, operation of the shown embodiment will be described. In the memory cell array including a number of memory cell banks, the selection lines S1 for non-selected memory cell banks are brought to Vt1, so as to deactivate the selection transistors BT11, BT12 and BT13 of all the non-selected memory cell banks, so that all of the non-selected memory cell banks are isolated from the main bit line D1. Thus, a parasitic capacitance of the main bit line D1 is greatly reduced.

Next, if the memory cell to be read out is included in the shown memory cell bank, for example, when the memory cell M1 is read out, firstly, one main bit line D1 and two main ground lines VG1 and VG2 are selected by a Y decoder (not shown) in order to select one memory bank. As the result of the selection of these three wirings, the main bit line D1 is connected to a sense amplifier SA, and the main ground line VG1 is connected to ground by the switching circuit 20, and the main ground line VG2 is connected to the precharge circuit 10 by the switching circuit 20 so that the main ground line VG2 is charged by the precharge circuit 10.

Furthermore, the block selection line S1 is brought to Vt3 so as to turn on all the block selection transistors BT11, BT12 and BT13, so that the diffused layer wirings L2 and L3 are connected to the main bit line D1. On the other hand, the block selection line S2 is brought to a low level so as to turn off the block selection transistor BT14, so that the diffused layer wiring L2 is isolated from the main ground line VG1. Finally, by action of an X decoder (not shown), the word line W1 connected to the gate of the memory cell M1 to be selected, is brought to a high level, and the other word lines are brought to a low level.

Thus, there are formed a current path starting from the main bit line D1 to pass through the block selection transistor BT12 and the memory cell M1 and to reach the main ground line VG1 connected to the ground, as shown by a broken line 1 in FIG. 1, and another path starting from the main bit line D1 to pass through the block selection transistor BT11 and the memory cells M2 and M1 and to reach the main ground line VG1 connected to the ground, as shown by a broken line 2 in FIG. 1. On the other hand, no substantial current flows through the memory cells M3 and M4, since no substantial potential difference exists between the sense amplifier SA and the main ground line VG2 charged by the precharge circuit 10.

In this situation, a discharge current I flowing from the main bit line D1 to the main ground line VG1, takes one of four different current values, dependently upon a combination between the threshold value of the memory cell M1 and the threshold value of the memory cell M2. Here, it is assumed that, when both the threshold value of the memory cell M1 and the threshold value of the memory cell M2 are high, the discharge current is I1, and when the threshold value of the memory cell M1 is high and the threshold value of the memory cell M2 is low, the discharge current is I2. When the threshold value of the memory cell M1 is low and the threshold value of the memory cell M2 is high, the discharge current is I3, and when both the threshold value of the memory cell M1 and the threshold value of the memory cell M2 are low, the discharge current is I4.

When the threshold value of the memory cell M1 is high, since the memory cell M1 is high resistive, the discharge currents I1 and I2 are small, regardless of the threshold value of the memory cell M2. On the other hand, when the threshold value of the memory cell M1 is low, since the memory cell M1 is low resistive, the discharge currents I3 and I4 are considerably larger than the discharge currents I1 and I2, regardless of the threshold value of the memory cell M2, because a current easily flows through the current path 1 to the main ground line VG1. Namely, since there is a considerably large current difference between the discharge currents I1 and I2 when the threshold value of the memory cell M1 is high, and the discharge currents I3 and I4 when the threshold value of the memory cell M1 is low, it is possible to detect this current difference by the sense amplifier SA. Therefore, if it is previously determined that for example when the discharge current is I1 and I2, the stored information is indicative of "1" and when the discharge current is I3 and I4, the stored information is indicative of "0", it is possible to read the stored information. Accordingly, the shown embodiment can read the stored information with only two selection lines for each one memory back.

Next, the case of reading the memory cell M2 is considered. Similarly to the case of reading the memory cell M1, one main bit line D1 and two main ground lines VG1 and VG2 are selected by the Y decoder in order to select one memory bank.

Then, the block selection line S1 is brought to Vt2 so as to turn on only the block selection transistor BT11, so that only the diffused layer wirings L3 is connected to the main bit line D1. On the other hand, the block selection line S2 is brought to a high level so as to turn on the block selection transistor BT14, so that the diffused layer wiring L2 is connected to the main ground line VG1. Namely, the diffused layer wirings L1 and L2 are connected to the main ground line VG1.

Furthermore, by action of the X decoder, the word line W1 connected to the gate of the memory cell M2 to be selected, is brought to a high level, and the other word lines are brought to a low level.

Thus, there are formed a current path starting from the main bit line D1 to pass through the memory cell M2, the wiring L2 and the block selection transistor BT14 and to reach the main ground line VG1 connected to the ground, and another path starting from the main bit line D1 to pass the memory cells M2 and M1 and the wiring L1 and to reach the main ground line VG1. Therefore, when the threshold value of the memory cell M2 is high, since the memory cell M2 is high resistive, the discharge current flowing to the main ground line VG1 is small, regardless of the threshold value of the memory cell M1. On the other hand, when the threshold value of the memory cell M2 is low, since the memory cell M2 is low resistive, the discharge current is considerably large, regardless of the threshold value of the memory cell M1. Thus, it is possible to read information stored in the memory cell M2.

In the case of reading the memory cell M3 and M4, the switching circuit 20 is controlled so that the main ground line VG1 is connected to the precharge circuit 10 and the main ground line VG2 is connected to the ground. Operation similar to the above mentioned operation is performed.

Incidentally, it would be understood to persons skilled in the art that the wirings L2, L3 and L4 can be considered to be sub-bit lines in connection with the main bit line D1, and the wirings L1, L2, L4 and L5 can be considered to be sub-ground lines in connection with the main ground line VG1 and VG2.

Figure 4:
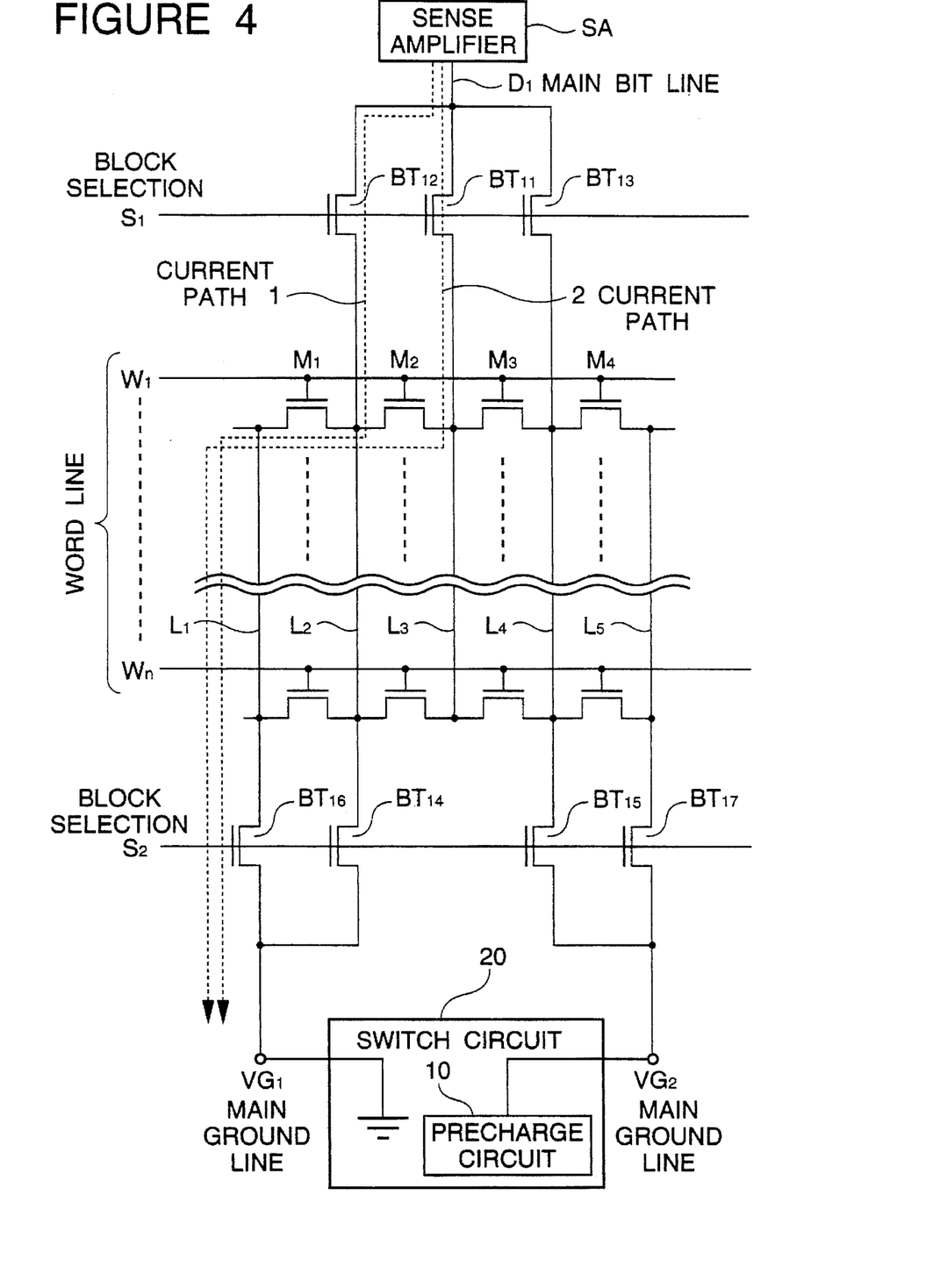
FIG. 4 is a circuit diagram of one unitary memory cell bank provided in a second embodiment of the semiconductor memory in accordance with the present invention constituted of a number of lateral memory cells.
Figure 5:
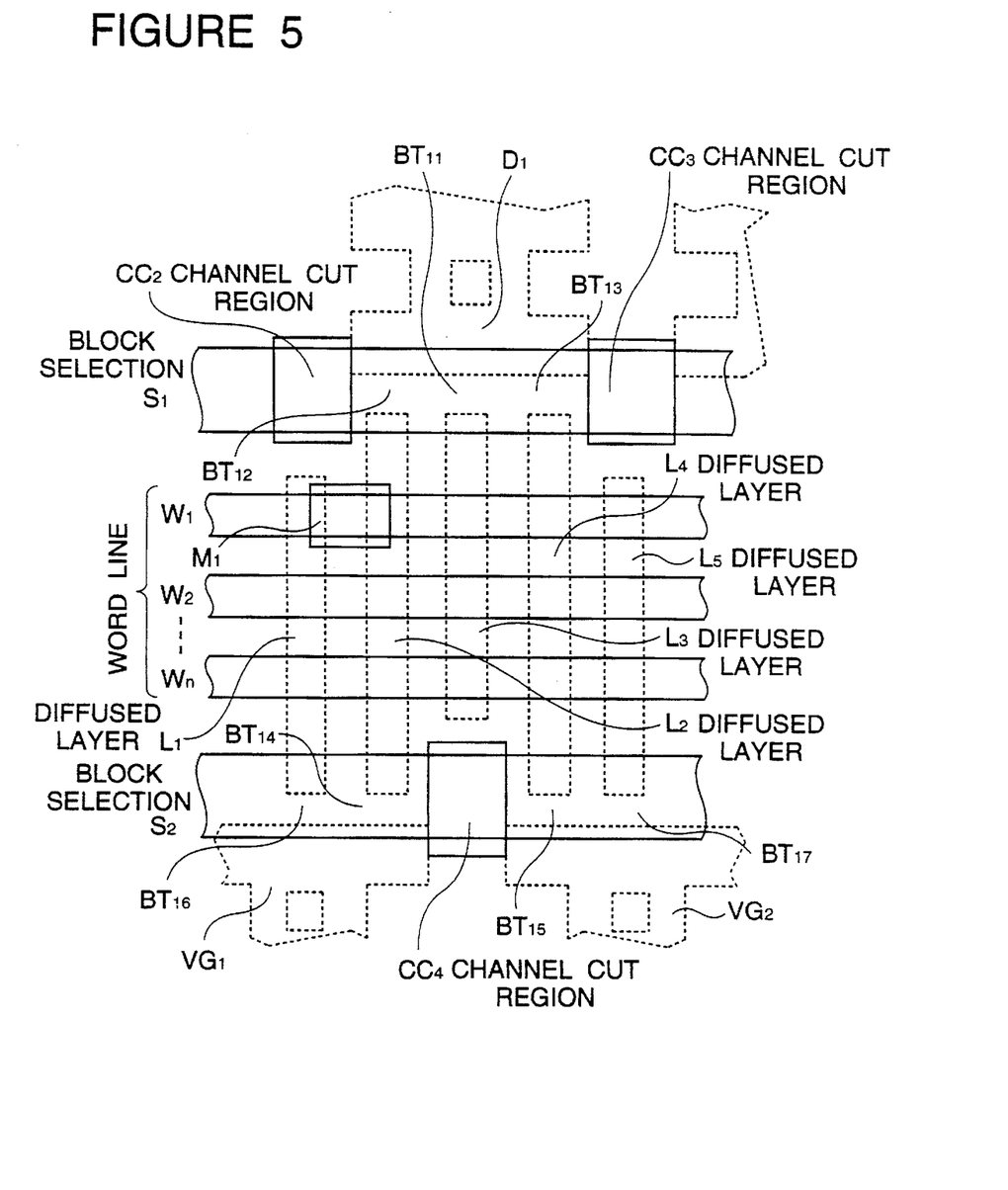
FIG. 5 is a partial layout pattern illustrating the structure of the unitary memory cell bank shown in FIG. 4.

Referring to FIG. 4, there is shown a circuit diagram of one unitary memory cell bank provided in a second embodiment of the ROM in accordance with the present invention. FIG. 5 illustrates a partial layout pattern of the unitary memory cell bank shown in FIG. 4. In FIGS. 4 and 5, elements similar or corresponding to those shown in FIGS. 2 and 3 are given the same Reference Numerals, and explanation thereof will be omitted for simplification of description.

As seen from comparison between FIGS. 2 and 4, the second embodiment includes, in addition to the construction of the first embodiment, a block selection transistor BT16 connected between the wiring L1 and the main ground line VG1, and a block selection transistor BT17 connected between the wiring L5 and the main ground line VG2. Furthermore, these block selection transistors BT16 and BT17 has a threshold Vt2, and on the other hand, the block selection transistors BT14 and BT15 has a threshold Vt3. A gate of each of the block selection transistors BT14 to BT17 is connected in common to the block selection line S2, which in turn takes one of three difference levels Vt1, Vt2 and Vt3. Here, Vt1<Vt2<Vt3.

With this arrangement, by bring the block selection line S2 of all non-selected memory cell blocks to Vt1, the block selection transistors BT14 to BT17 of all non-selected memory cell blocks are turned off, so that all the non-selected memory cell blocks are isolated or separated from the main ground lines VG1 and VG2. Therefore, a parasitic capacitance of the main ground lines VG1 and VG2 can be greatly reduced, and accordingly, a precharging time for the main ground line can be shortened so that a high speed reading can be realized.

Furthermore, in order to form the block selection transistors BT14 to BT17 connected as shown in FIG. 4, a channel cut region CC4 is formed in a transistor channel region which is positioned under the block selection line S2 and which is positioned between the wirings L2 and L4, as shown in FIG. 5.

At the time of reading the memory cell M1, the voltage Vt2 is applied to the block selection line S2 so as to turn on the block selection transistors BT16 and BT17 and to maintain the block selection transistors BT14 and BT15 in the OFF condition. The other operation is the same as that of the first embodiment. In this case, a current flows as shown by broken lines in FIG. 4.

At the time of reading the memory cell M2, the voltage Vt3 is applied to the block selection line S2 so as to turn on all the block selection transistors BT14 to BT17. The other operation is the same as that of the first embodiment.

As seen from the above, the present invention can reduce the number of selection lines per memory cell bank, from four to two, in the lateral memory cell structure ROM, while maintaining the capability of the memory cell reading. Therefore, it is possible to reduce the area required per memory cell bank, and accordingly, it is very advantageous in developing a ROM having a large memory capacity and a small area. In addition, by causing the selection transistors to have a plurality of thresholds, it is possible to isolate the non-selected memory cell banks from the main bit line and the main ground lines by controlling the two block selection lines provided for each one memory cell bank. Accordingly, it is possible to reduce the parasitic capacitance of the main bit line and the main ground lines. This is very effective to a high speed operation.

The invention has thus been shown and described with reference to the specific embodiments. However, it should be noted that the present invention is in no way limited to the details of the illustrated structures but changes and modifications may be made within the scope of the appended claims.

We claim:

1. A semiconductor memory comprising:

a main bit line;

a plurality of word lines located in parallel to each other;

a plurality of wirings located in parallel to each other and extending to intersect said plurality of word lines, said plurality of wirings including a first wiring having one end thereof connected through a first switching transistor to said main bit line, a second wiring having one end thereof connected to a voltage supply terminal, and a third wiring located between said first wiring and said second wiring and having one end thereof connected through a second switching transistor to said main bit line and the other end thereof connected through a third switching transistor to said voltage supply terminal;

a plurality of memory cell transistors located at intersections between said plurality of word lines and said plurality of wirings to form a memory cell matrix, said plurality of memory cell transistors being connected in such a manner that, in each of rows of said memory cell matrix, a first memory cell transistor is connected between said first wiring and said third wiring and a second memory cell transistor is connected between said second wiring and said third wiring, and a gate of each of said first and second memory cell transistors is connected to one corresponding word line of said plurality of word lines; and a first selection line connected to both a gate of said first switching transistor and a gate of said second switching transistor, a threshold of said first switching transistor being lower than that of said second switching transistor; and a second selection line connected to a gate of said third switching transistor.

2. A semiconductor memory as claimed in claim 1, wherein said main bit line has one end which is connected to a sense amplifier and another end which is connected to said first and second switching transistors, and said voltage supply terminal is connected to ground.

3. A semiconductor memory as claimed in claim 1, wherein each of said memory cell transistors has any one of four different thresholds.

4. A semiconductor memory as claimed in claim 1, wherein said second wiring is connected through a fourth switching transistor to said voltage supply terminal, and wherein said second selection line being connected to both said gate of said third switching transistor and a gate of said fourth switching transistor, a threshold of said fourth switching transistor being lower than that of said third switching transistor.

5. A read only semiconductor memory comprising:

a main bit line;

first and second main ground lines;

a plurality of word lines located in parallel to each other; and at least one memory cell bank coupled to said main bit line and said first and second main ground lines, said at least one memory cell bank including:

a plurality of wirings located in parallel to each other and extending to intersect said plurality of word lines, said plurality of wirings including a first wiring having one end thereof connected through a first switching transistor to said main bit line, a second wiring having one end thereof connected to a first voltage supply terminal, a third wiring located between said first wiring and said second wiring and having one end thereof connected through a second switching transistor to said main bit line and the other end thereof connected through a third switching transistor to said first voltage supply terminal, a fourth wiring having one end thereof connected to a second voltage supply terminal, and a fifth wiring located between said first wiring and said fourth wiring and having one end thereof connected through a fourth switching transistor to said main bit line and the other end thereof connected through a fifth switching transistor to said second voltage supply terminal;

a plurality of read only memory cell transistors located at intersections between said plurality of word lines and said plurality of wirings to form a memory cell matrix, said plurality of read only memory cell transistors being connected in such a manner that, in each of rows of said memory cell matrix, a first memory cell transistor is connected between said first wiring and said third wiring, a second memory cell transistor is connected between said second wiring and said third wiring, a third memory cell transistor is connected between said first wiring and said fifth wiring, and a fourth memory cell transistor is connected between said fourth wiring and said fifth wiring, and a gate of each of said first to fourth memory cell transistors is connected to one corresponding word line of said plurality of word lines;

a first selection line connected in common to a gate of said first switching transistor, a gate of said second switching transistor and a gate of said fourth switching transistor, a threshold of said first switching transistor being lower than that of said second switching transistor and said fourth switching transistor; and a second selection line connected in common to a gate of said third switching transistor and a gate of said fifth switching transistor.

6. A semiconductor memory as claimed in claim 5, further including a switching circuit connected to said first and second voltage supply terminals, for selectively supplying different voltages to said first voltage supply terminal and said second voltage supply terminal.

7. A semiconductor memory as claimed in claim 5, wherein said second wiring is connected through a sixth switching transistor to said first voltage supply terminal, and said fourth wiring is connected through a seventh switching transistor to said second voltage supply terminal, said second selection line being also connected in common to a gate of said sixth switching transistor and a gate of said seventh switching transistor, a threshold of said sixth switching transistor and said seventh switching transistor being lower than that of said third switching transistor and said fifth switching transistor.

8. A semiconductor memory comprising a main bit line and a plurality of sub-bit lines, each of which is connected through a MOS field effect transistor to said main bit line, said MOS field effect transistor of one of said sub-bit lines having a threshold different from that of said MOS field effect transistor of another of said sub-bit lines, and said MOS field effect transistors having gates which are commonly connected.

9. A semiconductor memory as claimed in claim 8, further comprising a first main ground line and a first plurality of sub-ground lines, each of which is connected through a MOS field effect transistor to said first main ground line, said MOS field effect transistor of one of said sub-ground lines having a threshold different from that of said MOS field effect transistor of another of said sub-ground lines, and said MOS field effect transistors which connect said sub-ground lines to said first main ground line having gates which are commonly connected.

10. A semiconductor memory as claimed in claim 9, further comprising a second main ground line and a second plurality of sub-ground lines each of which is connected through a MOS field effect transistor to said second main ground line, said MOS field effect transistor of one of said second plurality of sub-ground lines having a threshold different from that of said MOS field effect transistor of another one of said second plurality of said sub-ground lines, and said MOS field effect transistors which connect said second plurality of sub-ground lines to said second main ground line having gates which are commonly connected to each other and to said gates of said MOS field effect transistors which connect said first plurality of sub-ground lines to said first main ground line.

11. A semiconductor memory comprising a main ground line and a plurality of sub-ground lines, each of which is connected through a MOS field effect transistor to said main ground line, said MOS field effect transistor of one of said sub-ground lines having a threshold different from that of said MOS field effect transistor of another of said sub-ground lines, and said MOS field effect transistors having gates which are commonly connected.

* * * * *